(12) United States Patent
Kim et al.

(10) Patent No.: US 8,482,310 B2
(45) Date of Patent: Jul. 9, 2013

(54) TEST METHOD FOR PASSIVE DEVICE EMBEDDED PRINTED CIRCUIT BOARD

(75) Inventors: Hyun-Ho Kim, Suwon-si (KR);
Won-Geun Jung, Chungjoo-si (KR);
Yul-Kyo Chung, Yongin-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 331 days.

(21) Appl. No.: 12/854,684

(22) Filed: Aug. 11, 2010

(65) Prior Publication Data
US 2011/0215828 A1 Sep. 8, 2011

(30) Foreign Application Priority Data
Mar. 5, 2010 (KR) .................. 10-2010-0019803

(51) Int. Cl.
*G01R 31/28* (2006.01)
*G01R 31/304* (2006.01)

(52) U.S. Cl.
USPC ........................................ 324/763.01

(58) Field of Classification Search
None
See application file for complete search history.

(56) References Cited

U.S. PATENT DOCUMENTS

| | | | |
|---|---|---|---|
| 6,937,035 B2 * | 8/2005 | Kawaike et al. | 324/754.29 |
| 7,928,819 B2 * | 4/2011 | Lee et al. | 333/185 |
| 8,051,558 B2 * | 11/2011 | Lin et al. | 29/846 |
| 2009/0224849 A1 * | 9/2009 | Lee et al. | 333/185 |
| 2009/0267628 A1 * | 10/2009 | Takase | 324/755 |
| 2011/0273202 A1 * | 11/2011 | Kim et al. | 324/763.01 |
| 2012/0146516 A1 * | 6/2012 | Kim et al. | 315/134 |
| 2012/0221989 A1 * | 8/2012 | Liang et al. | 716/112 |

FOREIGN PATENT DOCUMENTS

| | | |
|---|---|---|
| JP | 2003-017858 A | 1/2003 |
| JP | 2006-222606 A | 8/2006 |
| JP | 2006-324633 A | 11/2006 |
| TW | 2006-41377 | 12/2006 |
| TW | 2007-26339 | 7/2007 |

OTHER PUBLICATIONS

Japanese Office Action, and English translation thereof, issued in Japanese Patent Application No. 2010-186403 dated Jun. 5, 2012.
English translation of the Official Letter of Pending Patent Application Under Examination issued in Chinese Patent Application No. 099124557 dated Apr. 19, 2013.

* cited by examiner

*Primary Examiner* — Jermele M Hollington
(74) *Attorney, Agent, or Firm* — McDermott Will & Emery LLP

(57) ABSTRACT

A method of testing a passive device embedded printed circuit board is disclosed. The method in accordance with an embodiment of the present invention includes: applying an AC power to a printed circuit board in which a filter including at least two of a resistor, an inductor and a capacitor is embedded; measuring a property of the filter for the applied AC power; and determining whether or not the printed circuit board is defective by comparing the measured property of the filter with a design value.

2 Claims, 4 Drawing Sheets

(a) Level 1   (b) Level 2   (c) Level 3   (d) Level 4

TEST METHOD FOR PASSIVE DEVICE EMBEDDED PRINTED CIRCUIT BOARD

CROSS-REFERENCE TO RELATED APPLICATIONS

This application claims the benefit of Korean Patent Application No. 10-2010-0019803, filed with the Korean Intellectual Property Office on Mar. 5, 2010, the disclosure of which is incorporated herein by reference in its entirety.

BACKGROUND

1. Technical Field

The present invention is related to a test method for a printed circuit board in which a passive device is embedded.

2. Description of the Related Art

The conventional passive devices have been mostly mounted on a board by use of the surface mount technology (SMT). However, as the electronic products increasingly become smaller, new packaging technologies for embedding passive devices in the board are actively being developed.

By integrating multiple passive devices in an organic board, the passive device embedded board can be manufactured more cost-effectively and is expected to contribute to making the mobile phones smaller.

However, while there has been an increasing demand for products in which passive devices (e.g., capacitor, inductor, resistor, filter, etc.) are embedded in the board using the conventional board technologies and embedded packaging technologies, there have been few test solutions for the passive device embedded board.

Currently, during the manufacturing and maintenance of the board, the board needs to be tested due to quality problems, making it imperative to undertake a step of testing the board in order to secure an adequate product quality. Moreover, while the board industry is moving toward more advanced, integrated, high-functional, reliable and precision technologies, the test equipment for the board needs to be able to provide a more concrete test and measurement in order to address a variety of problems and secure sufficient board qualities. The board test has been used many times for saving the time and cost and improving the quality and productivity by testing the performance of the board, solving mounting errors, such as warpage of a device, mis-insertion, reverse-insertion and reverse polarity, and detecting under-soldering, over-soldering and short-circuit.

The purpose of the conventional board test was not to test the passive device embedded board but to detect any open/short circuit of lines for the board. Since the conventional board tester was only able to test the open/short circuit, it was impossible to test any printed circuit board having a passive device embedded therein.

SUMMARY

The present invention provides a method of testing the performance of a printed circuit board having a passive device embedded therein.

An aspect of the present invention features a method of testing a passive device embedded printed circuit board is disclosed. The method in accordance with an embodiment of the present invention can include: applying an AC power to a printed circuit board in which a filter including at least two of a resistor, an inductor and a capacitor is embedded; measuring a property of the filter for the applied AC power; and determining whether or not the printed circuit board is defective by comparing the measured property of the filter with a design value.

The measured property of the filter can be at least one of insertion loss, bandwidth, skirt property, noise level and S-parameter (scattering parameter).

Additional aspects and advantages of the present invention will be set forth in part in the description which follows, and in part will be obvious from the description, or may be learned by practice of the invention.

DETAILED DESCRIPTION

Figure 1:
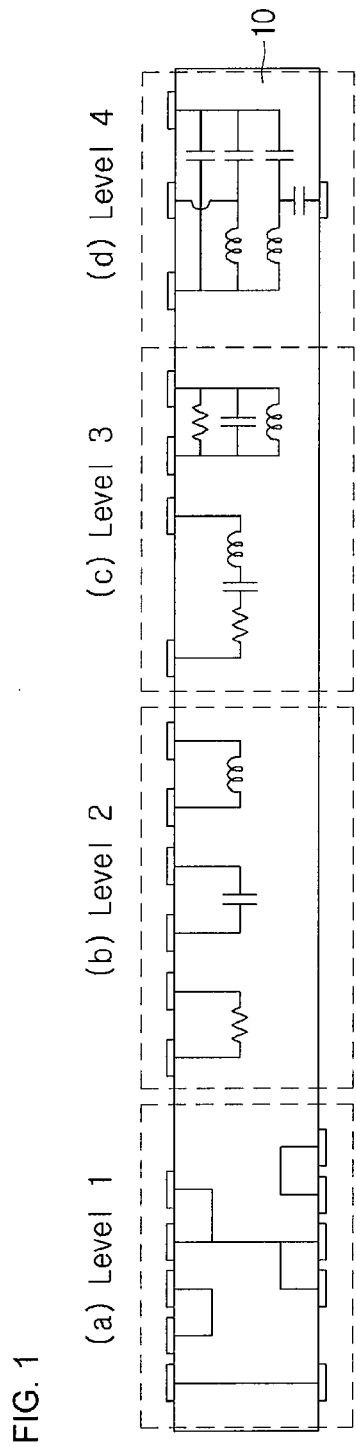
FIG. 1 illustrates different test levels in a method of testing a printed circuit board in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain technology is determined to evade the point of the present invention, the pertinent detailed description will be omitted.

Hereinafter, some embodiments of a method of testing an electro device embedded printed circuit board will be described in detail with reference to the accompanying drawings. Identical or corresponding elements will be given the same reference numerals, regardless of the figure number, and any redundant description of the identical or corresponding elements will not be repeated.

As the present invention is related to a test method for measuring a printed circuit board having a passive device embedded therein, the items for electrical testing for the printed circuit board in which the passive device is embedded can be classified as shown in [Table 1] below. The test items are divided into 4 levels, from level 1 to level 4, depending on the difficulty and type of the technology.

TABLE 1

Test level for passive device embedded printed circuit board

| Test Level | Test Item |
|---|---|
| Level 1 | Open/Short Test on Normal Interconnects |
| Level 2 | Single R/C/L Passive Components Test |
| Level 3 | Series & Parallel L/C/R Passive Components Test |
| Level 4 | Combined Series & Parallel L/C/R Passive Components Test |

Test level 1 is conducted for Nets (see (a) in FIG. 1) in which transmission lines, which exist within a board and transmit electrical signals and electric power, are not connected to any passive device. As illustrated in (a) of FIG. 1, the Net to which no passive device is connected is simply given an electrical interconnection test to check whether it is open between two test points existing in the same Net and an isolation test to check whether it is short between two test points existing in different Nets.

Test level 2, which is illustrated in (b) of FIG. 1, is an electrical test conducted when one passive device is connected to the transmission line, and measures an electrical property of the connected passive device.

Test level 3, which is illustrated in (c) of FIG. 1, is an electrical test conducted when a plurality of passive devices have a serial or parallel connection, and measures an electrical property of each of the connected passive devices.

Test level 4, which is illustrated in (d) of FIG. 1, measures the property of the whole circuit when a plurality of passive devices are connected in series and in parallel.

In an actual passive device embedded printed circuit board, the arrangement of the passive devices existing in the printed circuit board and the connection structure of the transmission lines can be classified as shown in (a) to (d) of FIG. 1. Hereinafter, each test level will be described in detail.

1. Test Level 1

Figure 2:
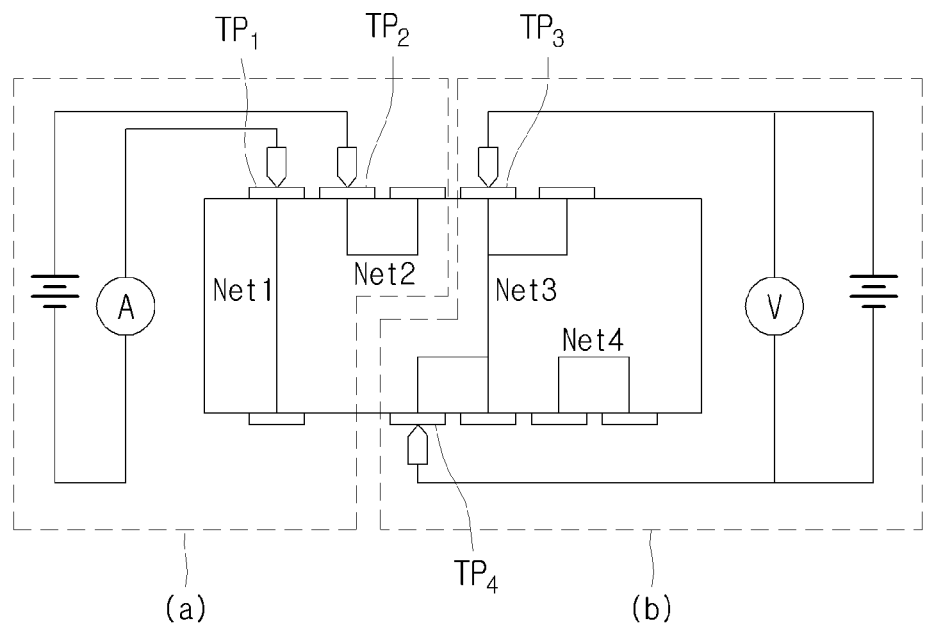
FIG. 2 illustrates a test method of test level 1.

For networks constituted by transmission lines only and not connected to any passive device, as shown in FIG. 2, the electrical test is focused on whether the networks of conductive lines are properly structured according to the design. Therefore, as shown in (b) of FIG. 2, a current and a voltage generated as a result of applying a constant current and a constant voltage between test points connected by a same Net are measured, and whether the network is open is checked by measuring resistance. Likewise, resistance is measured in the same way between test points constituted by another Net to check whether the network is short.

For example, as shown in (a) of FIG. 2, test point 1 (TP1) and test point 2 (TP2) exist in Net1 and Net2, respectively. In this case, if resistance measured between TP1 and TP2 is below a reference resistance value, it can be inferred that Net1 and Net2 are in the state of short, that is, Net1 and Net2 are not, unlike the design, electrically separated. Moreover, as shown in (b) of FIG. 2, both test point 3 (TP3) and test point 4 (TP4) exist in Net3. In this case, if resistance measured between TP3 and TP4 is above the reference resistance value, it can be determined that Net3 and Net4 are in the state of open, that is, Net3 and Net4 are not electrically connected. Some of the common test equipment include the Multi Tester, which can measure the voltage and the current, and the Source Meter, which is integrated in a power source and thus can measure the resistance directly.

In the meantime, it is possible to additionally conduct a low-level test and a high-current test for detecting micro-open, which is one of the reasons causing a progressive defect of a printed circuit board, and micro-short, which causes noise in an RF system.

2. Test Level 2

Figure 3:
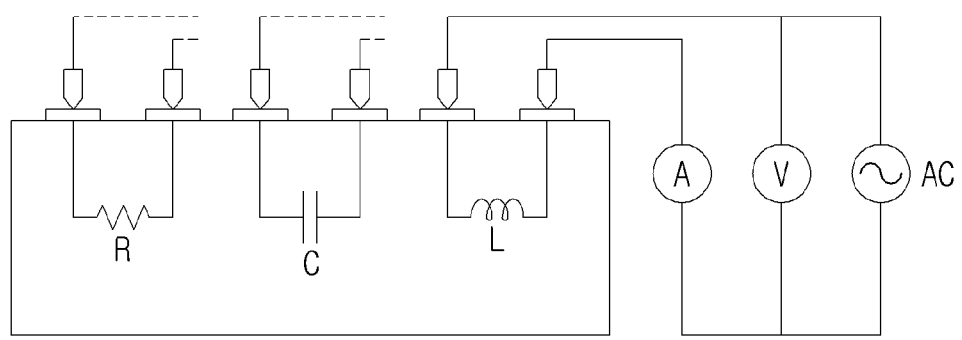
FIG. 3 illustrates a test method of test level 2.

As shown in FIG. 3, when one passive device is connected to a transmission line, the electrical test is focused on verification of the electrical properties of the passive device and the interconnection of the transmission line. However, if there is a problem with the interconnection of the transmission line, the measured properties of the passive device are greatly affected, and thus testing the interconnection of the transmission line can be substituted by testing the electrical properties of the passive device only.

The properties of the passive device can be tested in various ways depending on the type of the passive device, and the range of electric signals used for the testing shall be changed according to the capacity of the passive device. In the case of a resistor, a constant voltage and a constant current can be used to detect a voltage and a current, and the resistance value can be measured, like the method used in test level 1. However, in the case of a capacitor and an inductor, an AC power, which changes the size and direction of its voltage and current with time and has a frequency component, needs to be used in order to measure the capacitance (C) and inductance (L) up to a low capacity value.

In test level 2, as shown in FIG. 3, by applying an AC signal having a proper frequency and size to a test point to which a passive device is connected, the size and phase of the voltage and current generated in the circuit are measured. Through this, an impedance value of the circuit in which the passive device is included can be measured, and the resistance, capacitance and inductance can be calculated from the measured the impedance value by using an equivalent model of the circuit.

Common equipment for measuring the resistor, capacitor, inductor and impedance of the circuit includes the LCR Meter and the Impedance Analyzer, and the range of measurable resistance, capacitance and inductance may be limited according to the range of measurable voltage and current as well as the range of available frequency.

Generally, low-level capacitance and inductance can be detected when the measurement frequency is higher, but parasitic components on a circuit, which had little effect on the measurement and thus were ignorable in a low frequency, are gradually increased in a higher frequency, causing error in the result of measurement.

3. Test Level 3

Figure 4:
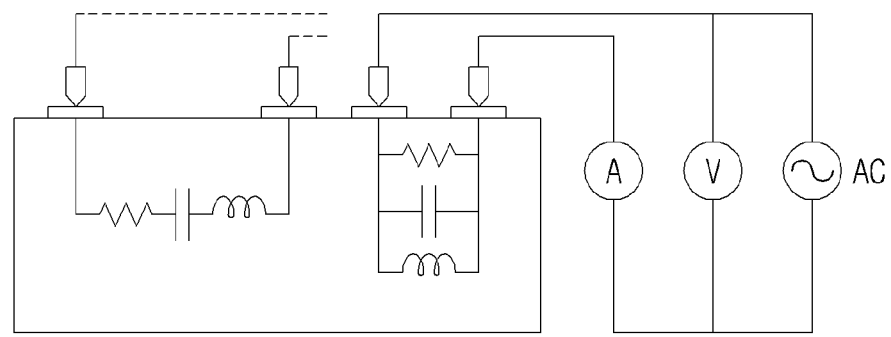
FIG. 4 illustrates a test method of test level 3.

As shown in FIG. 4, when a plurality of passive devices are bundled together in series or in parallel, the electrical test is focused on verification of the electrical properties of each passive device and verification of the electrical integrity of transmission lines connecting the passive devices. As in the case of test level 2, the measured properties of the passive device are greatly affected if there is any problem in the interconnection of the transmission line, and thus testing the interconnection of the transmission line can be substituted by testing the electrical properties of the passive device.

Like test level 2, test level 3 uses an AC power, which changes the size and direction of its voltage and current with time and has a frequency component. However, since at least 2 passive devices are connected in test level 3, the impedance value measured through test points installed on both ends of the circuit is a result of aggregating the impedance properties of all of the connected passive devices. Measuring the total impedance is not sufficient to guarantee the performance of each passive device because the electrical properties of the embedded devices have tolerance. In addition, it would be possible to measure each passive device by use of a guarding circuit.

Therefore, test level 3 suggests that whether each passive device is good or bad is determined by measuring the total impedance and phase in at least two specific frequencies. The frequency can be selected by running a simulation program or performing a calculation where the properties of each passive device are well represented. A more definitive analysis would be possible if any continuous change in impedance and phase according to the frequency is measured.

Common equipment for measuring the impedance and phase of a target circuit according to the frequency includes Impedance Analyzer and Network Analyzer, and the measurement can be more precise when the range of measurable frequencies is wider. It is preferable that the measuring equipment is changed to high frequency equipment as the measurement frequency becomes higher.

It is preferable that a probe tip used to make an electrical connection at the test points of the printed circuit board and the transmission lines for transferring electrical signals to the measurement equipment are usable in the high-frequency range. It is also possible that the test points of the board, in which the passive devices are embedded, are predesigned and placed on the printed circuit board so that a common probe tip for high frequency can be used to conduct the measurement without separately making a high-cost interface for high frequency.

4. Test Level 4

Figure 5:
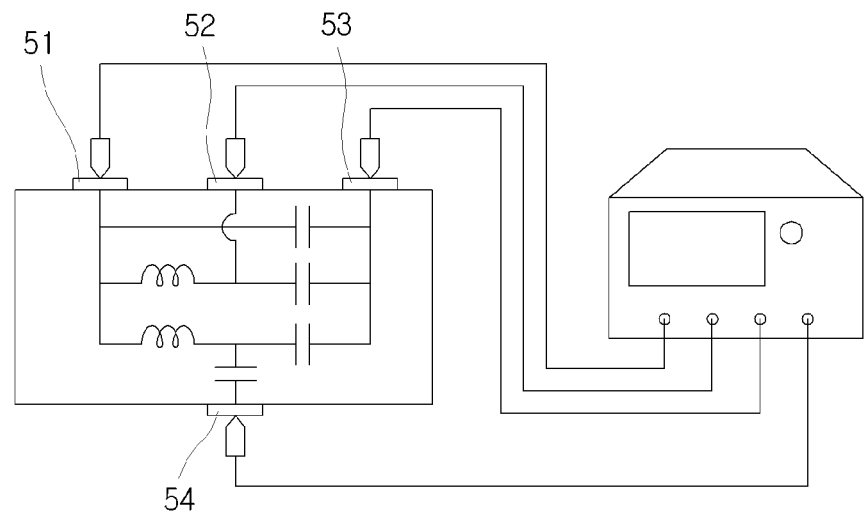
FIG. 5 illustrates a test method of test level 4.

FIG. 5 illustrates how measurement is made when a plurality of passive devices are provided in series and/or in parallel to function as a signal filter in a system. In this case, the electrical test is focused on the result of signal processing that is desired to be achieved through this circuit, rather than the electrical properties of each passive device.

As in the case of test level 2, the measured properties of the circuit are greatly affected if there is any problem in the interconnection of the transmission line, and thus testing the interconnection of the transmission line can be substituted by testing the electrical properties of the whole circuit.

An item for evaluating the property of the filter can include an S-parameter (scattering parameter) based on a frequency. Common equipment for specifying the S-parameter includes Network Analyzer. As shown in FIG. 5, each of test pads 51, 52, 53, 54, which function as ports of the filter, is connected to a corresponding measurement port of Network Analyzer. By sharing a frequency signal distribution result of an input and output for each port, the S-parameter can be measured.

Meanwhile, the printed circuit board, which is the object of measurement, has a design value through a circuit modeling and simulation. That is, the design value is pre-obtained through the modeling and simulation, and abnormality of the printed circuit board is determined by comparing the design value with a measured value.

Here, the electrical properties that each passive device has can not be measured. Therefore, it is not possible to determine which passive device has a problem. However, if any of the passive devices is defective, the overall property of the filter also becomes different from the simulation result, and thus can be used to determine the integrity. In addition to the S-parameter, other factors, such as insertion loss, bandwidth, skirt property, noise level, etc., can be used to determine whether the device is good or bad.

5. Test Flow of Passive Device Embedded Printed Circuit Board

Figure 6:
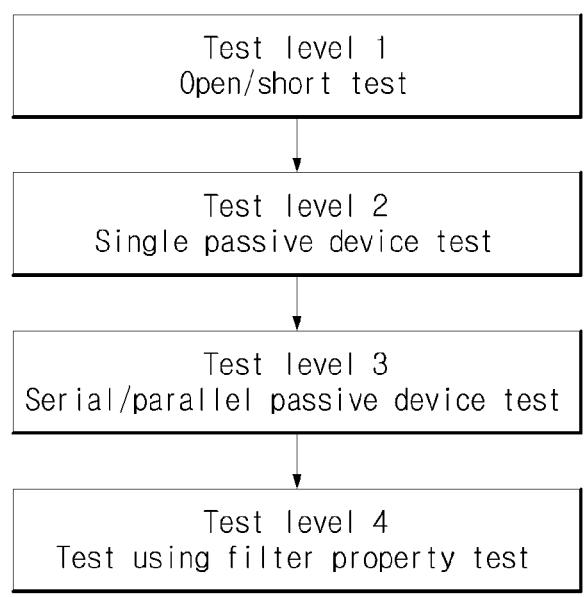
FIG. 6 is a flow diagram illustrating a method of testing a printed circuit board in accordance with an embodiment of the present invention.

FIG. 6 shows a test flow, which is preferably conducted in the order of level 1→level 2→level 3→level 4. However, it is also possible to interchange the order because the connection state is not related to the whole circuit.

Hitherto, some embodiments of the present invention have been described. However, it shall be appreciated by anyone ordinarily skilled in the art to which the present invention pertains that there can be a variety of permutations and modifications of the present invention without departing from the technical ideas and scopes of the present invention that are disclosed in the claims appended below.

A large number of embodiments in addition to the above-described embodiments are present within the claims of the present invention.

What is claimed is:

1. A method of testing a passive device embedded printed circuit board, the method comprising steps of:
    testing whether or not a transmission line, to which no passive device is connected, is open-circuited or short-circuited;
    measuring a total impedance by applying an AC power to a transmission line to which one or more passive devices are connected;
    comparing the measured total impedance with a design value; and
    measuring a property of a filter including the passive devices,
    wherein the measured property of the filter is at least one of insertion loss, bandwidth, skirt property, noise level and S-parameter (scattering parameter).

2. The method of claim 1, further comprising the steps of:
    applying a further AC power to a printed circuit board in which the filter is embedded, the filter including at least two of a resistor, an inductor and a capacitor,
    measuring a further property of the filter for the applied further AC power; and
    determining whether or not the printed circuit board is defective by comparing the measured further property of the filter with a design value.

* * * * *